(12) United States Patent
Kim et al.

(10) Patent No.: US 11,742,308 B2
(45) Date of Patent: Aug. 29, 2023

(54) SEMICONDUCTOR PACKAGE FOR REDUCING STRESS TO REDISTRIBUTION VIA

(71) Applicant: SAMSUNG ELECTRONICS CO., LTD., Suwon-si (KR)

(72) Inventors: Seok Hwan Kim, Suwon-si (KR); Han Kim, Suwon-si (KR); Kyung Ho Lee, Suwon-si (KR); Kyung Moon Jung, Suwon-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 0 days.

(21) Appl. No.: 16/932,185

(22) Filed: Jul. 17, 2020

(65) Prior Publication Data
US 2020/0350270 A1 Nov. 5, 2020

Related U.S. Application Data

(63) Continuation of application No. 15/965,590, filed on Apr. 27, 2018, now Pat. No. 10,734,342.

(30) Foreign Application Priority Data

Dec. 19, 2017 (KR) .......................... 10-2017-0175274

(51) Int. Cl.
*H01L 23/00* (2006.01)
*H01L 23/28* (2006.01)
(Continued)

(52) U.S. Cl.
CPC .............. *H01L 24/14* (2013.01); *H01L 23/16* (2013.01); *H01L 23/28* (2013.01);
(Continued)

(58) Field of Classification Search
CPC ......... H01L 24/14; H01L 23/16; H01L 23/28; H01L 23/49816; H01L 23/5384;
(Continued)

(56) References Cited

U.S. PATENT DOCUMENTS 10,157,864 B1 * 12/2018 Yu ........................... H01L 24/19
2002/0020855 A1 2/2002 Hwang
(Continued)

FOREIGN PATENT DOCUMENTS

JP 2006-073622 A 3/2006
JP 2013-543272 A 11/2013
(Continued)

OTHER PUBLICATIONS

Office Action issued in corresponding Korean Application No. 10-2017-0175274, dated Mar. 4, 2019.

*Primary Examiner* — Nduka E Ojeh
*Assistant Examiner* — Eric W Jones
(74) *Attorney, Agent, or Firm* — Sughrue Mion, PLLC

(57) ABSTRACT

A semiconductor package includes: a connection member having a first surface and a second surface opposing each other in a stacking direction of the semiconductor package and including an insulating member and a redistribution layer formed on the insulating member and having a redistribution via; a semiconductor chip disposed on the first surface of the connection member and having connection pads connected to the redistribution layer; an encapsulant disposed on the first surface of the connection member and encapsulating the semiconductor chip; a passivation layer disposed on the second surface of the connection member; UBM pads disposed on the passivation layer and overlapping the redistribution vias in the stacking direction; and UBM vias connecting the UBM pads to the redistribution layer through the passivation layer, not overlapping the
(Continued)

redistribution vias with respect to the stacking direction, and having a non-circular cross section.

16 Claims, 12 Drawing Sheets

(51) Int. Cl.
*H01L 23/498* (2006.01)
*H01L 23/538* (2006.01)
*H01L 23/16* (2006.01)
*H01L 23/31* (2006.01)

(52) U.S. Cl.
CPC .... *H01L 23/49816* (2013.01); *H01L 23/5384* (2013.01); *H01L 23/562* (2013.01); *H01L 23/3128* (2013.01); *H01L 2224/16225* (2013.01); *H01L 2224/18* (2013.01); *H01L 2224/32225* (2013.01); *H01L 2224/73204* (2013.01); *H01L 2924/1431* (2013.01); *H01L 2924/1433* (2013.01); *H01L 2924/1436* (2013.01); *H01L 2924/181* (2013.01); *H01L 2924/3511* (2013.01)

(58) Field of Classification Search
CPC ............ H01L 23/562; H01L 23/3128; H01L 2224/16225; H01L 2224/18; H01L 2224/32225; H01L 2224/73204; H01L 2924/1431; H01L 2924/1433; H01L 2924/1436; H01L 2924/181; H01L 2924/3511
USPC .......................................... 257/734, 736, 738
See application file for complete search history.

(56) References Cited

U.S. PATENT DOCUMENTS

| 2005/0039154 | A1* | 2/2005 | Nguyen ................ G06F 30/394 |
| | | | 716/112 |
| 2006/0044735 | A1 | 3/2006 | Hayashi et al. |
| 2007/0200239 | A1 | 8/2007 | Su |
| 2009/0278263 | A1 | 11/2009 | McCarthy et al. |
| 2010/0193950 | A1 | 8/2010 | Lee et al. |
| 2011/0204515 | A1 | 8/2011 | Fazelpour |
| 2012/0038044 | A1 | 2/2012 | Chang et al. |
| 2012/0104604 | A1 | 5/2012 | McCarthy et al. |
| 2014/0203438 | A1 | 7/2014 | Chen et al. |
| 2014/0210080 | A1 | 7/2014 | Chang et al. |
| 2015/0318262 | A1 | 11/2015 | Gu et al. |
| 2016/0056087 | A1 | 2/2016 | Wu et al. |
| 2016/0211206 | A1 | 7/2016 | Lee et al. |
| 2017/0103951 | A1 | 4/2017 | Lee et al. |
| 2017/0133309 | A1 | 5/2017 | Kim et al. |
| 2017/0271283 | A1 | 9/2017 | Lee et al. |
| 2017/0278812 | A1 | 9/2017 | Lee et al. |
| 2017/0323853 | A1 | 11/2017 | Hu et al. |
| 2017/0338200 | A1 | 11/2017 | Huang et al. |
| 2018/0047571 | A1 | 2/2018 | Hunt et al. |

FOREIGN PATENT DOCUMENTS

| KR | 10-2015-0116308 A | 10/2015 |
| KR | 10-2017-0043440 A | 4/2017 |
| KR | 10-2017-0054875 A | 5/2017 |
| KR | 10-2017-0112905 A | 10/2017 |
| WO | 2012/061381 A2 | 5/2012 |

* cited by examiner

SEMICONDUCTOR PACKAGE FOR REDUCING STRESS TO REDISTRIBUTION VIA

CROSS-REFERENCE TO RELATED APPLICATION(S)

This application is a Continuation of Ser. No. 15/965,590 filed on Apr. 27, 2018 in the United States Patent and Trademark Office, which is based on and claims the benefit of priority to Korean Patent Application No. 10-2017-0175274 filed on Dec. 19, 2017 in the Korean Intellectual Property Office, the entire disclosures of which are herein incorporated by reference.

TECHNICAL FIELD

The present disclosure relates to a semiconductor package.

BACKGROUND

Recently, package technology for thinness and lightness has been actively studied, but a thermal cycle, impact reliability, or the like, in a manufacturing process or a use environment is very important. A typical example of such a reliability problem includes interface delamination or cracking of a redistribution via connecting a semiconductor chip and a redistribution layer (RDL) to each other and cracking of an electrical connection structure such as a solder ball.

In order to solve the cracking of the electrical connection structure, an underbump metallurgy (UBM) structure has been widely used between the electrical connection structure and the redistribution layer. However, in a semiconductor package (particularly, a panel level semiconductor package) having the redistribution via of the redistribution layer and the UBM structure, stress applied to the redistribution via of the redistribution layer has been a large factor of a reliability problem.

SUMMARY

An aspect of the present disclosure may provide a semiconductor package having a new underbump metallurgy (UBM) structure capable of decreasing stress applied to a redistribution via of a redistribution layer.

According to an aspect of the present disclosure, a semiconductor package may be provided, in which reliability for thermal impact may be secured by decreasing stress applied to a redistribution layer through adjustment of a structure and an array of a UBM pad and a UBM via related to a redistribution via of the redistribution layer.

According to an aspect of the present disclosure, a semiconductor package may include: a connection member having a first surface and a second surface opposing each other in a stacking direction of the semiconductor package and including an insulating member and a redistribution layer formed on the insulating member and having a redistribution via; a semiconductor chip disposed on the first surface of the connection member and having connection pads connected to the redistribution layer; an encapsulant disposed on the first surface of the connection member and encapsulating the semiconductor chip; a passivation layer disposed on the second surface of the connection member; UBM pads disposed on the passivation layer and overlapping the redistribution vias in the stacking direction; and UBM vias penetrating through the passivation layer to connect the redistribution layer and the UBM pads to each other, not overlapping the redistribution vias in the stacking direction, and having a non-circular cross section.

According to another aspect of the present disclosure, a semiconductor package may include: a connection member having a first surface and a second surface opposing each other in a stacking direction of the semiconductor package and including an insulating member and a plurality of redistribution layers disposed on different levels in the insulating member in the stacking direction, each of the plurality of redistribution layers having a redistribution via, and the plurality of redistribution layers including at least a first redistribution layer adjacent to the first surface and a second redistribution layer adjacent to the second surface; a semiconductor chip disposed on the first surface of the connection member and having connection pads connected to the first redistribution layer; a support member disposed on the first surface of the connection member and having a cavity in which the semiconductor chip is accommodated; an encapsulant disposed on the first surface of the connection member and encapsulating the support member and the semiconductor chip; a passivation layer disposed on the second surface of the connection member; UBM pads disposed on the passivation layer; and UBM vias penetrating through the passivation layer to connect the UBM pads and the second redistribution layer to each other and having a non-circular cross section, wherein the redistribution via of the second redistribution layer is disposed to overlap the UBM pad and not to overlap the UBM via in a stacking direction of the connection member.

BRIEF DESCRIPTION OF DRAWINGS

The above and other aspects, features, and advantages of the present disclosure will be more clearly understood from the following detailed description taken in conjunction with the accompanying drawings, in which.

DETAILED DESCRIPTION

Hereinafter, exemplary embodiments in the present disclosure will be described with reference to the accompanying drawings. In the accompanying drawings, shapes, sizes, and the like, of components may be exaggerated or shortened for clarity.

The term "an exemplary embodiment" used herein does not refer to the same exemplary embodiment, and is provided to emphasize a particular feature or characteristic different from that of another exemplary embodiment. However, exemplary embodiments provided herein are considered to be able to be implemented by being combined in whole or in part one with one another. For example, one element described in a particular exemplary embodiment, even if it is not described in another exemplary embodiment, may be understood as a description related to another exemplary embodiment, unless an opposite or contradictory description is provided therein.

Terms used herein are used only in order to describe an exemplary embodiment rather than limiting the present disclosure. In this case, singular forms include plural forms unless interpreted otherwise in context.

Electronic Device

Figure 1:
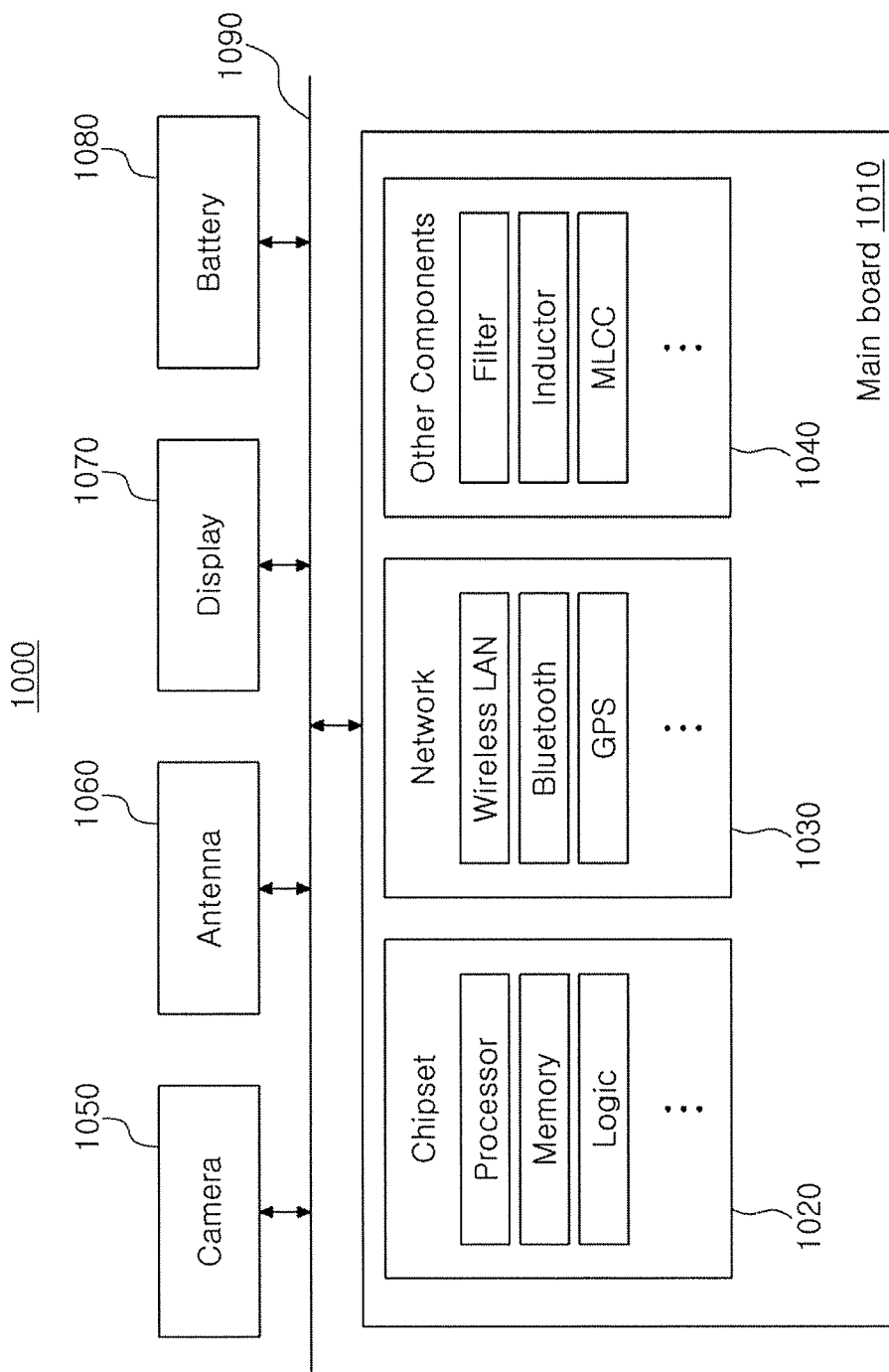
FIG. 1 is a schematic block diagram illustrating an example of an electronic device system.

FIG. 1 is a schematic block diagram illustrating an example of an electronic device system.

Referring to FIG. 1, an electronic device 1000 may accommodate a mainboard 1010 therein. The mainboard 1010 may include chip related components 1020, network related components 1030, other components 1040, and the like, physically or electrically connected thereto. These components may be connected to others to be described below to form various signal lines 1090.

The chip related components 1020 may include a memory chip such as a volatile memory (for example, a dynamic random access memory (DRAM)), a non-volatile memory (for example, a read only memory (ROM)), a flash memory, or the like; an application processor chip such as a central processor (for example, a central processing unit (CPU)), a graphics processor (for example, a graphics processing unit (GPU)), a digital signal processor, a cryptographic processor, a microprocessor, a microcontroller, or the like; and a logic chip such as an analog-to-digital (ADC) converter, an application-specific integrated circuit (ASIC), or the like. However, the chip related components 1020 are not limited thereto, but may also include other types of chip related components. In addition, the chip related components 1020 may be combined with each other.

The network related components 1030 may include protocols such as wireless fidelity (Wi-Fi) (Institute of Electrical And Electronics Engineers (IEEE) 802.11 family, or the like), worldwide interoperability for microwave access (WiMAX) (IEEE 802.16 family, or the like), IEEE 802.20, long term evolution (LTE), evolution data only (Ev-DO), high speed packet access+(HSPA+), high speed downlink packet access+(HSDPA+), high speed uplink packet access+(HSUPA+), enhanced data GSM environment (EDGE), global system for mobile communications (GSM), global positioning system (GPS), general packet radio service (GPRS), code division multiple access (CDMA), time division multiple access (TDMA), digital enhanced cordless telecommunications (DECT), Bluetooth, 3G, 4G, and 5G protocols, and any other wireless and wired protocols, designated after the abovementioned protocols. However, the network related components 1030 are not limited thereto, but may also include a variety of other wireless or wired standards or protocols. In addition, the network related components 1030 may be combined with each other, together with the chip related components 1020 described above.

Other components 1040 may include a high frequency inductor, a ferrite inductor, a power inductor, ferrite beads, a low temperature co-fired ceramic (LTCC), an electromagnetic interference (EMI) filter, a multilayer ceramic capacitor (MLCC), or the like. However, other components 1040 are not limited thereto, but may also include passive components used for various other purposes, or the like. In addition, other components 1040 may be combined with each other, together with the chip related components 1020 or the network related components 1030 described above.

Depending on a type of the electronic device 1000, the electronic device 1000 may include other components that may or may not be physically or electrically connected to the mainboard 1010. These other components may include, for example, a camera module 1050, an antenna 1060, a display device 1070, a battery 1080, an audio codec (not illustrated), a video codec (not illustrated), a power amplifier (not illustrated), a compass (not illustrated), an accelerometer (not illustrated), a gyroscope (not illustrated), a speaker (not illustrated), a mass storage unit (for example, a hard disk drive) (not illustrated), a compact disk (CD) drive (not illustrated), a digital versatile disk (DVD) drive (not illustrated), or the like. However, these other components are not limited thereto, but may also include other components used for various purposes depending on a type of electronic device 1000, or the like.

The electronic device 1000 may be a smartphone, a personal digital assistant (PDA), a digital video camera, a digital still camera, a network system, a computer, a monitor, a tablet PC, a laptop PC, a netbook PC, a television, a video game machine, a smartwatch, an automotive component, or the like. However, the electronic device 1000 is not limited thereto, but may be any other electronic device processing data.

Figure 2:
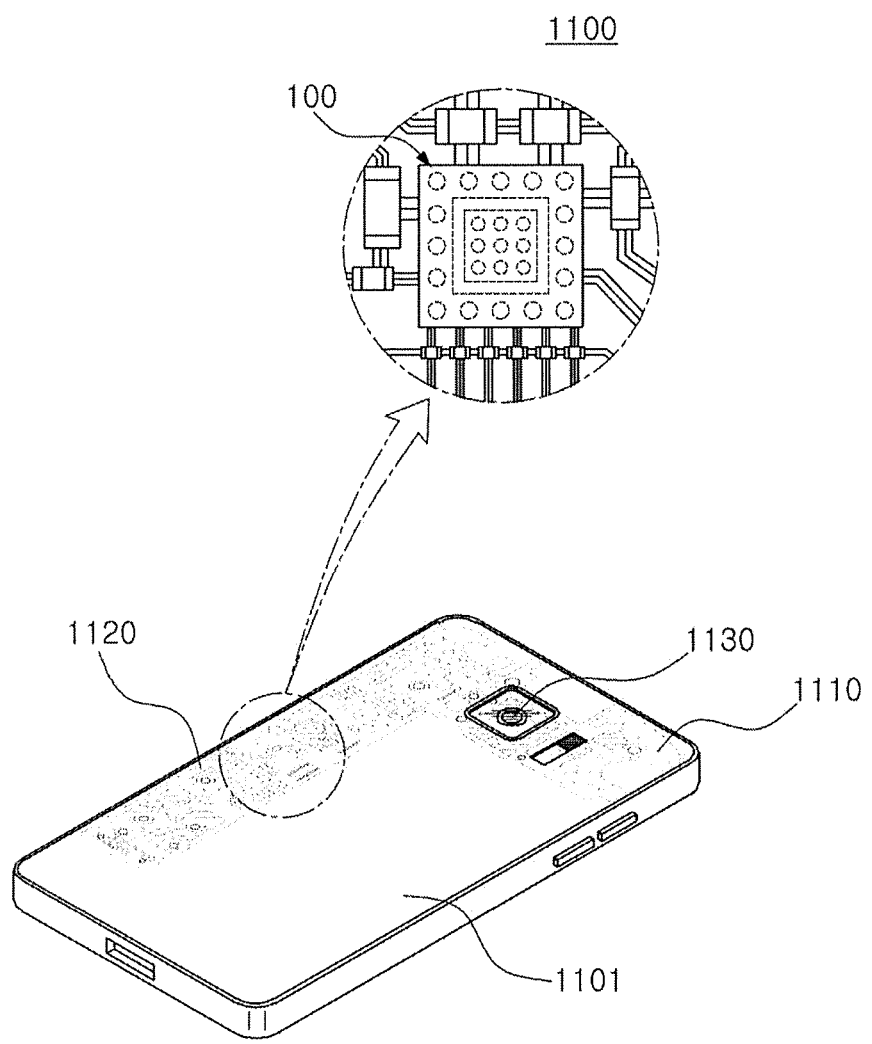
FIG. 2 is a schematic perspective view illustrating an example of an electronic device.

FIG. 2 is a schematic perspective view illustrating an example of an electronic device.

Referring to FIG. 2, a semiconductor package may be used for various purposes in the various electronic devices 1000 as described above. For example, a motherboard 1110 may be accommodated in a body 1101 of a smartphone 1100, and various electronic components 1120 may be physically or electrically connected to the motherboard 1110. In addition, other components that may or may not be physically or electrically connected to the mainboard 1010, such as a camera module 1130, may be accommodated in the body 1101. Some of the electronic components 1120 may be the chip related components, and the semiconductor package 100 may be, for example, an application processor among the chip related components, but is not limited thereto. The electronic device is not necessarily limited to the smartphone 1100, but may be other electronic devices as described above.

Semiconductor Package

Generally, numerous fine electrical circuits are integrated in a semiconductor chip. However, the semiconductor chip may not serve as a semiconductor finished product in oneself, and may be damaged due to external physical or chemical impact. Therefore, the semiconductor chip is not used in oneself, and is packaged and is used in an electronic device, or the like, in a package state.

The reason why semiconductor packaging is required is that there is a difference in a circuit width between the semiconductor chip and a mainboard of the electronic device in terms of electrical connection. In detail, a size of connection pads of the semiconductor chip and an interval between the connection pads of the semiconductor chip are very fine, but a size of component mounting pads of the mainboard used in the electronic device and an interval between the component mounting pads of the mainboard are significantly larger than those of the semiconductor chip. Therefore, it may be difficult to directly mount the semiconductor chip on the mainboard, and packaging technology for buffering a difference in a circuit width between the semiconductor and the mainboard is required.

A semiconductor package manufactured by the packaging technology may be classified as a fan-in semiconductor package or a fan-out semiconductor package depending on a structure and a purpose thereof.

The fan-in semiconductor package and the fan-out semiconductor package will hereinafter be described in more detail with reference to the drawings.

Fan-in Semiconductor Package

Figure 3:
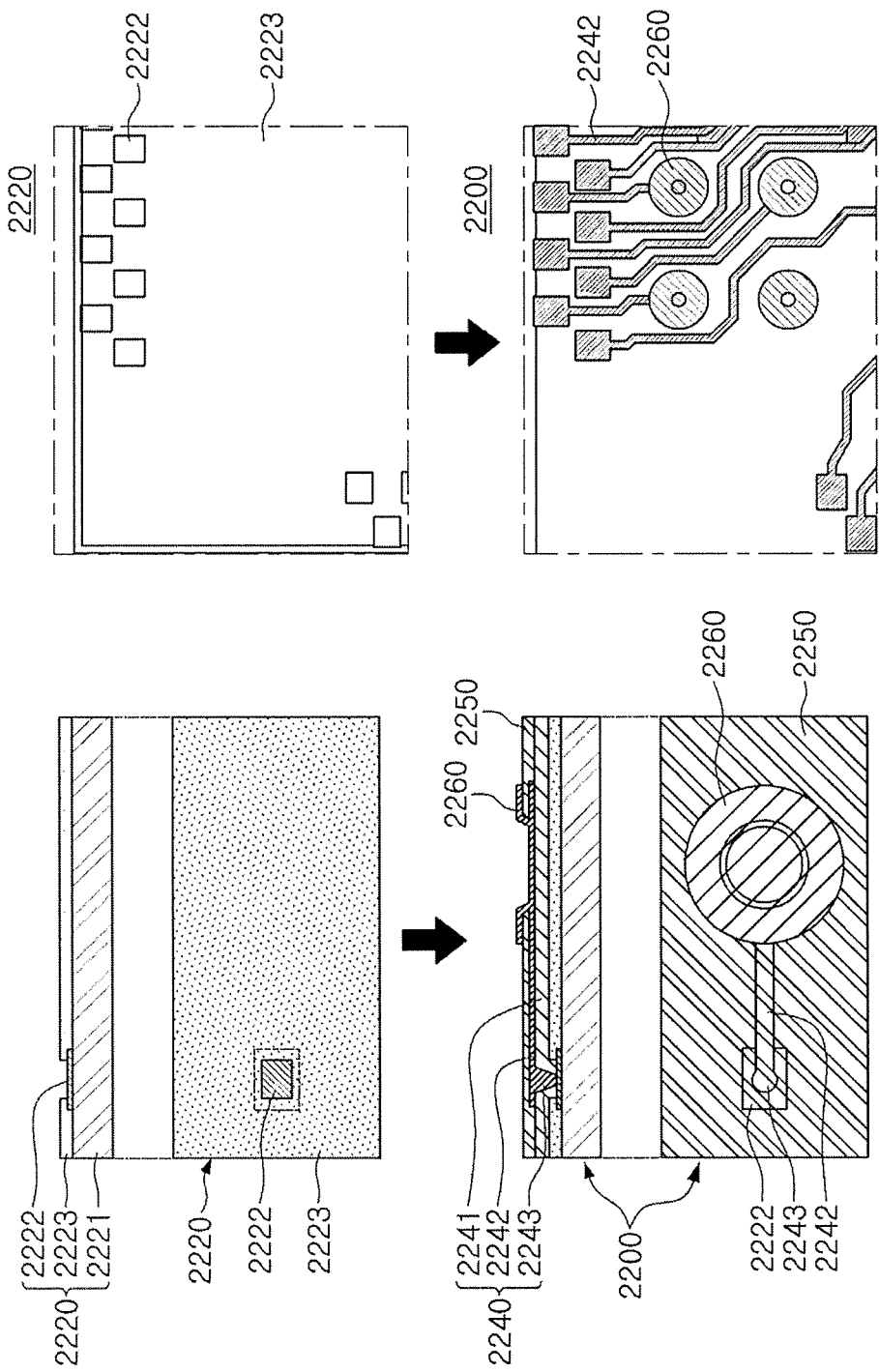
FIGS. 3A and 3B are schematic cross-sectional views illustrating states of a fan-in semiconductor package before and after being packaged.
Figure 4:
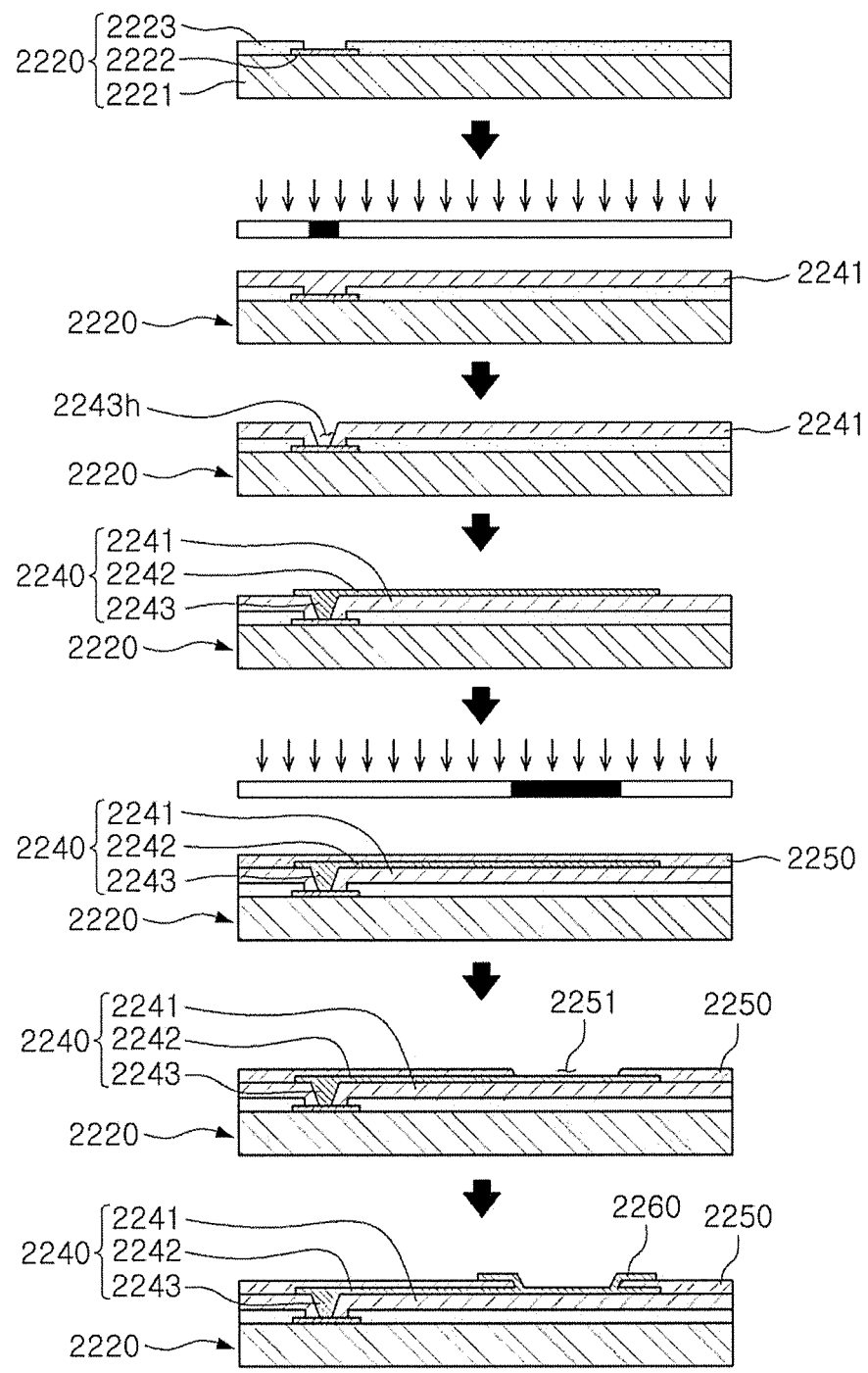
FIG. 4 is schematic cross-sectional views illustrating a packaging process of a fan-in semiconductor package.

FIGS. 3A and 3B are schematic cross-sectional views illustrating states of a fan-in semiconductor package before and after being packaged, and FIG. 4 is schematic cross-sectional views illustrating a packaging process of a fan-in semiconductor package.

Referring to FIGS. 3 and 4, a semiconductor chip 2220 may be, for example, an integrated circuit (IC) in a bare state, including a body 2221 including silicon (Si), germanium (Ge), gallium arsenide (GaAs), or the like, connection pads 2222 formed on one surface of the body 2221 and including a conductive material such as aluminum (Al), or the like, and a passivation layer 2223 such as an oxide film, a nitride film, or the like, formed on one surface of the body 2221 and covering at least portions of the connection pads 2222. In this case, since the connection pads 2222 may be significantly small, it may be difficult to mount the integrated circuit (IC) on an intermediate level printed circuit board (PCB) as well as on the mainboard of the electronic device, or the like.

Therefore, a connection member 2240 may be formed depending on a size of the semiconductor chip 2220 on the semiconductor chip 2220 in order to redistribute the connection pads 2222. The connection member 2240 may be formed by forming an insulating layer 2241 on the semiconductor chip 2220 using an insulating material such as a photoimagable dielectric (PID) resin, forming via holes 2243h opening the connection pads 2222, and then forming wiring patterns 2242 and vias 2243. Then, a passivation layer 2250 protecting the connection member 2240 may be formed, an opening 2251 may be formed, and an underbump metal layer 2260, or the like, may be formed. That is, a fan-in semiconductor package 2200 including, for example, the semiconductor chip 2220, the connection member 2240, the passivation layer 2250, and the underbump metal layer 2260 may be manufactured through a series of processes.

As described above, the fan-in semiconductor package may have a package form in which all of the connection pads, for example, input/output (I/O) terminals, of the semiconductor chip are disposed inside the semiconductor chip, and may have excellent electrical characteristics and be produced at a low cost. Therefore, many elements mounted in smartphones have been manufactured in a fan-in semiconductor package form. In detail, many elements mounted in smartphones have been developed to implement a rapid signal transfer while having a compact size.

However, since all I/O terminals need to be disposed inside the semiconductor chip in the fan-in semiconductor package, the fan-in semiconductor package has significant spatial limitations. Therefore, it is difficult to apply this structure to a semiconductor chip having a large number of I/O terminals or a semiconductor chip having a small size. In addition, due to the disadvantage described above, the fan-in semiconductor package may not be directly mounted and used on the mainboard of the electronic device. The reason is that even in the case in which a size of the I/O terminals of the semiconductor chip and an interval between the I/O terminals of the semiconductor chip are increased by a redistribution process, the size of the I/O terminals of the semiconductor chip and the interval between the I/O terminals of the semiconductor chip may not be sufficient to directly mount the fan-in semiconductor package on the mainboard of the electronic device.

Figure 5:
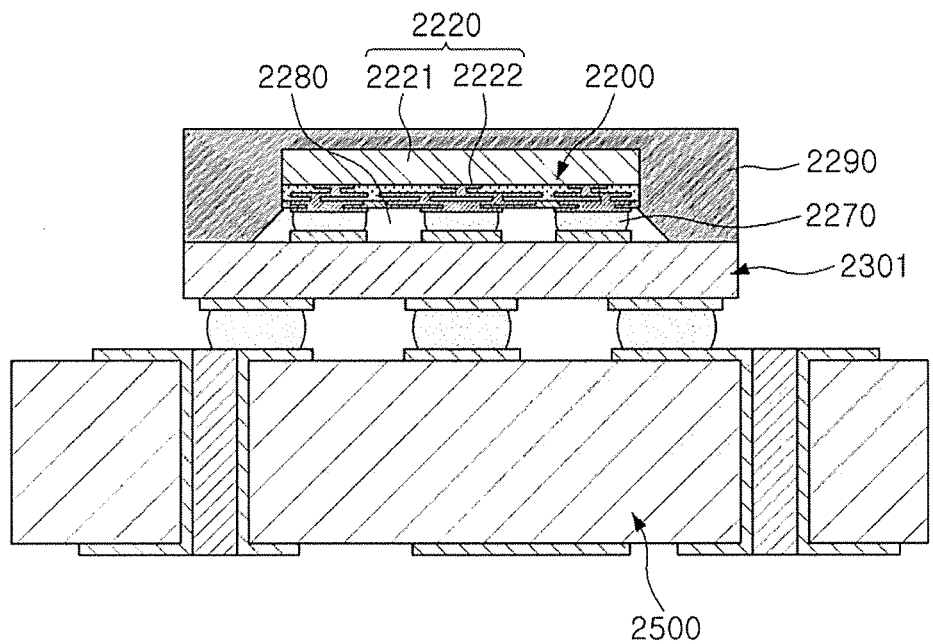
FIG. 5 is a schematic cross-sectional view illustrating a case in which a fan-in semiconductor package is mounted on an interposer substrate and is ultimately mounted on a mainboard of an electronic device.
Figure 6:
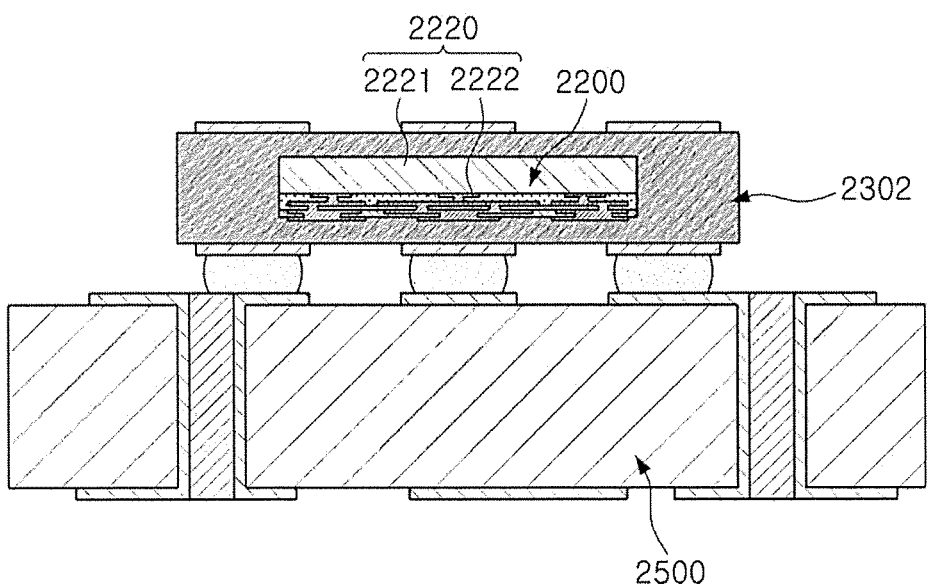
FIG. 6 is a schematic cross-sectional view illustrating a case in which a fan-in semiconductor package is embedded in an interposer substrate and is ultimately mounted on a mainboard of an electronic device.

FIG. 5 is a schematic cross-sectional view illustrating a case in which a fan-in semiconductor package is mounted on an interposer substrate and is ultimately mounted on a mainboard of an electronic device, and FIG. 6 is a schematic cross-sectional view illustrating a case in which a fan-in semiconductor package is embedded in an interposer substrate and is ultimately mounted on a mainboard of an electronic device.

Referring to FIG. 5, in a fan-in semiconductor package 2200, connection pads 2222, that is, I/O terminals, of a semiconductor chip 2220 may be redistributed once more through an interposer substrate 2301, and the fan-in semiconductor package 2200 may be ultimately mounted on a mainboard 2500 of an electronic device in a state in which it is mounted on the interposer substrate 2301. In this case, solder balls 2270, and the like, may be fixed by an underfill resin 2280, or the like, and an outer side of the semiconductor chip 2220 may be covered with an encapsulant 2290, or the like. Alternatively, a fan-in semiconductor package 2200 may be embedded in a separate interposer substrate 2302, connection pads 2222, that is, I/O terminals, of a semiconductor chip 2220 may be redistributed once more by the interposer substrate 2302 in a state in which the fan-in semiconductor package 2200 is embedded in the interposer substrate 2302, and the fan-in semiconductor package 2200 may be ultimately mounted on a mainboard 2500 of an electronic device.

As described above, it may be difficult to directly mount and use the fan-in semiconductor package on the mainboard of the electronic device. Therefore, the fan-in semiconductor package may be mounted on the separate interposer substrate and be then mounted on the mainboard of the electronic device through a packaging process or may be mounted and used on the mainboard of the electronic device in a state in which it is embedded in the interposer substrate.

Fan-Out Semiconductor Package

Figure 7:
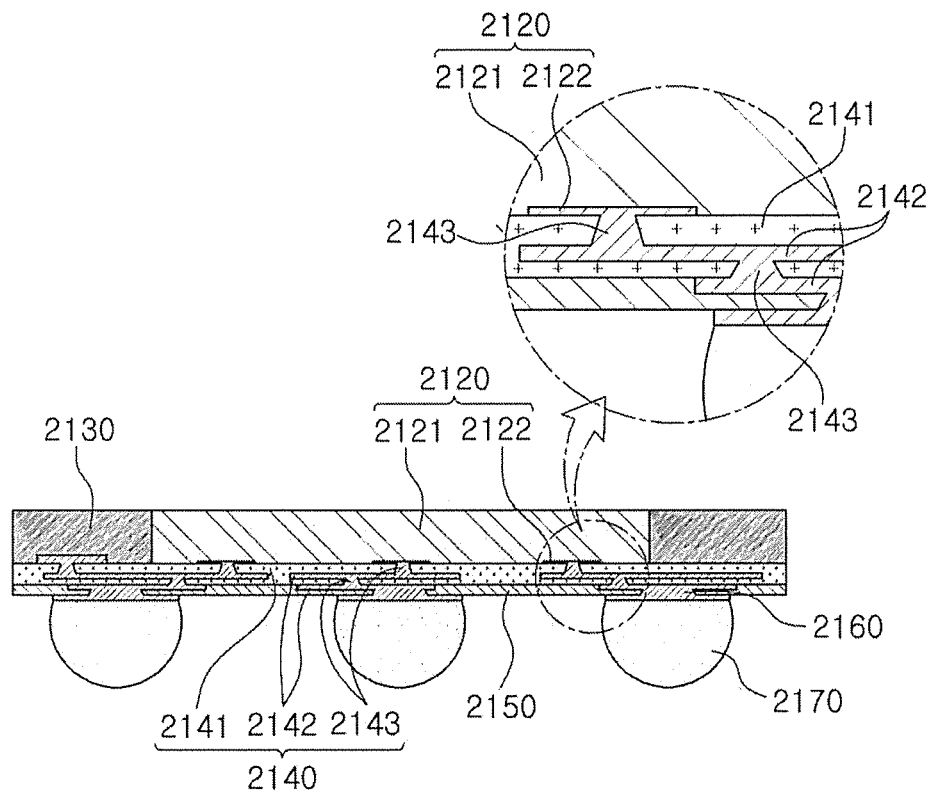
FIG. 7 is a schematic cross-sectional view illustrating a fan-out semiconductor package.

FIG. 7 is a schematic cross-sectional view illustrating a fan-out semiconductor package.

Referring to FIG. 7, in a fan-out semiconductor package 2100, for example, an outer side of a semiconductor chip 2120 may be protected by an encapsulant 2130, and connection pads 2122 of the semiconductor chip 2120 may be redistributed outwardly of the semiconductor chip 2120 by a connection member 2140. In this case, a passivation layer 2150 may further be formed on the connection member 2140, and an underbump metal layer 2160 may further be formed in openings of the passivation layer 2150. Solder balls 2170 may further be formed on the underbump metal layer 2160. The semiconductor chip 2120 may be an integrated circuit (IC) including a body 2121, the connection pads 2122, a passivation layer (not illustrated), and the like. The connection member 2140 may include an insulating layer 2141, redistribution layers 2142 formed on the insulating layer 2141, and vias 2143 electrically connecting the connection pads 2122 and the redistribution layers 2142 to each other.

In the present manufacturing process, the connection member 2140 may be formed after the encapsulant 2130 is formed outside the semiconductor chip 2120. In this case, a process for the connection member 2140 is performed from the via connecting the redistribution layers and the connection pads 2122 of the semiconductor chip 2120 to each other and the redistribution layers, and the vias 2143 may thus have a width that becomes small as they become to the semiconductor chip (see an enlarged region).

As described above, the fan-out semiconductor package may have a form in which I/O terminals of the semiconductor chip are redistributed and disposed outwardly of the semiconductor chip through the connection member formed on the semiconductor chip. As described above, in the fan-in semiconductor package, all I/O terminals of the semiconductor chip need to be disposed inside the semiconductor chip. Therefore, when a size of the semiconductor chip is decreased, a size and a pitch of balls need to be decreased, such that a standardized ball layout may not be used in the fan-in semiconductor package. On the other hand, the fan-out semiconductor package has the form in which the I/O terminals of the semiconductor chip are redistributed and disposed outwardly of the semiconductor chip through the connection member formed on the semiconductor chip as described above. Therefore, even in the case in which a size of the semiconductor chip is decreased, a standardized ball layout may be used in the fan-out semiconductor package as it is, such that the fan-out semiconductor package may be mounted on the mainboard of the electronic device without using a separate interposer substrate, as described below.

Figure 8:
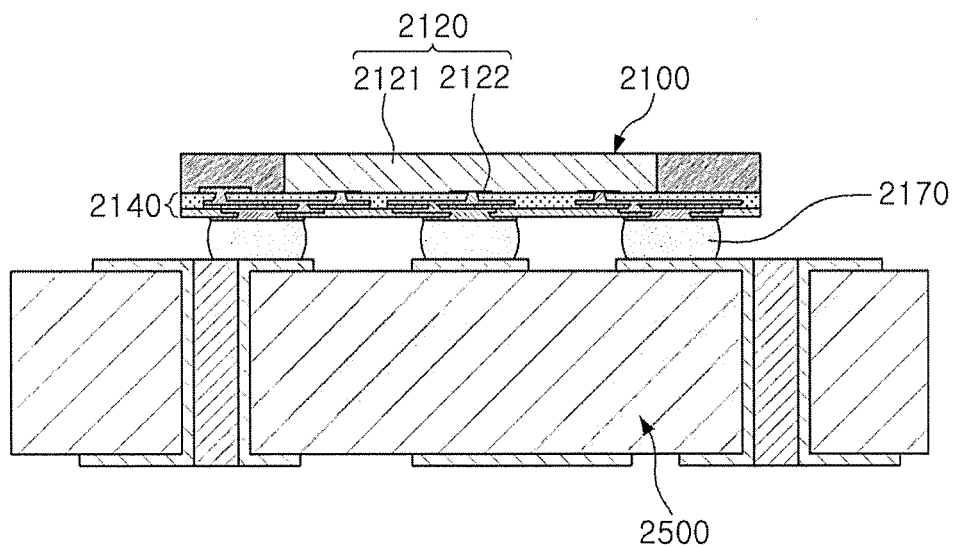
FIG. 8 is a schematic cross-sectional view illustrating a case in which a fan-out semiconductor package is mounted on a mainboard of an electronic device.

FIG. 8 is a schematic cross-sectional view illustrating a case in which a fan-out semiconductor package is mounted on a mainboard of an electronic device.

Referring to FIG. 8, a fan-out semiconductor package 2100 may be mounted on a mainboard 2500 of an electronic device through solder balls 2170, or the like. That is, as described above, the fan-out semiconductor package 2100 includes the connection member 2140 formed on the semiconductor chip 2120 and capable of redistributing the connection pads 2122 to a fan-out region that is outside of a size of the semiconductor chip 2120, such that the standardized ball layout may be used in the fan-out semiconductor package 2100 as it is. As a result, the fan-out semiconductor package 2100 may be mounted on the mainboard 2500 of the electronic device without using a separate interposer substrate, or the like.

As described above, since the fan-out semiconductor package may be mounted on the mainboard of the electronic device without using the separate interposer substrate, the fan-out semiconductor package may be implemented at a thickness lower than that of the fan-in semiconductor package using the interposer substrate. Therefore, the fan-out semiconductor package may be miniaturized and thinned. In addition, the fan-out semiconductor package has excellent thermal characteristics and electrical characteristics, such that it is particularly appropriate for a mobile product. Therefore, the fan-out semiconductor package may be implemented in a form more compact than that of a general package-on-package (POP) type using a printed circuit board (PCB), and may solve a problem due to the occurrence of a warpage phenomenon.

Meanwhile, the fan-out semiconductor package refers to package technology for mounting the semiconductor chip on the mainboard of the electronic device, or the like, as described above, and protecting the semiconductor chip from external impacts, and is a concept different from that of a printed circuit board (PCB) such as an interposer substrate, or the like, having a scale, a purpose, and the like, different from those of the fan-out semiconductor package, and having the fan-in semiconductor package embedded therein.

Various exemplary embodiments in the present disclosure will hereinafter be described in detail with reference to the accompanying drawings.

Figure 9:
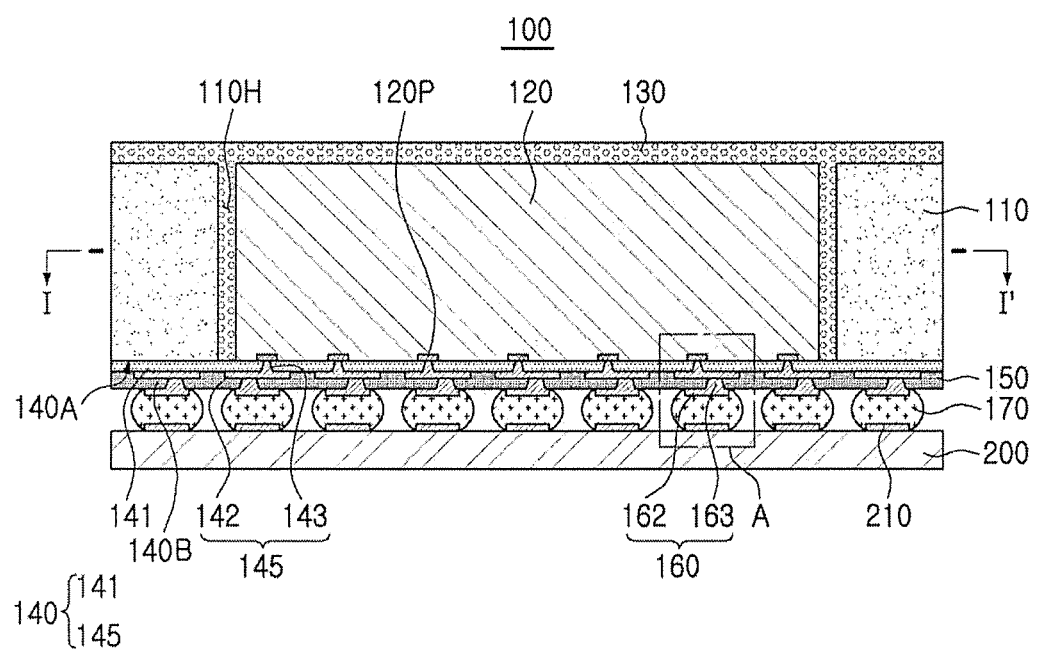
FIG. 9 is a side cross-sectional view illustrating a semiconductor package according to an exemplary embodiment in the present disclosure.
Figure 10:
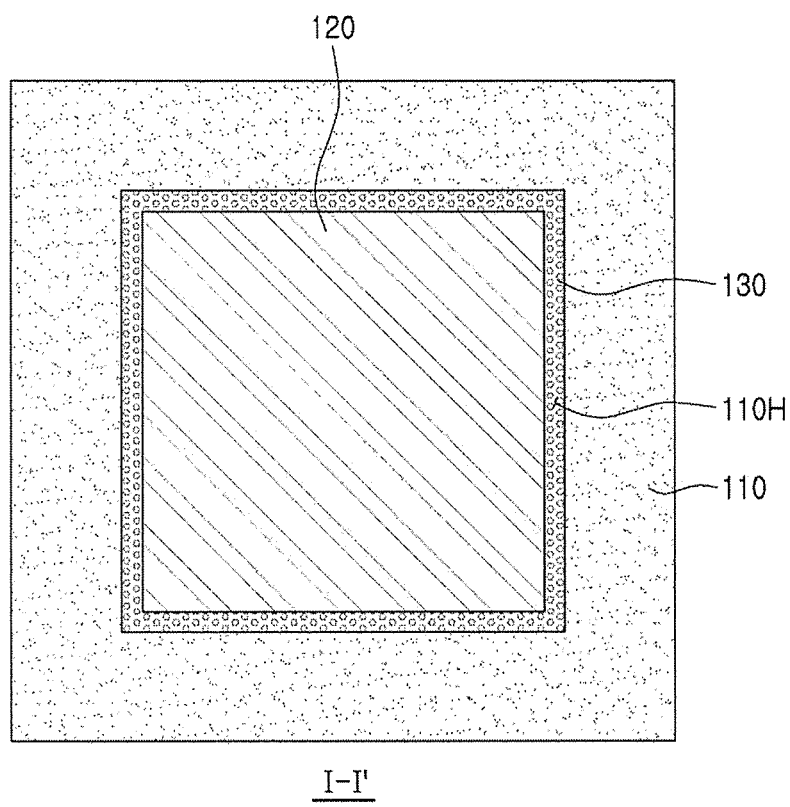
FIG. 10 is a plan view taken along line I-I' of the semiconductor package illustrated in FIG. 9.

FIG. 9 is a side cross-sectional view illustrating a semiconductor package according to an exemplary embodiment in the present disclosure, and FIG. 10 is a plan view taken along line I-I' of the semiconductor package illustrated in FIG. 9.

Referring to FIGS. 9 and 10, a semiconductor package 100 according to the present exemplary embodiment may include a support member 110 having a cavity 110H, a connection member 140 having a first surface 140A on which the support member 110 is disposed and a second surface 140B opposing the first surface 140A in a stacking direction of the semiconductor package 100 and including a redistribution layer (RDL) 145, a semiconductor chip 120 disposed in the cavity 110H of the support member 110, or disposed on the first surface 140A of the connection member 140 and having connection pads 120P connected to the redistribution layer 145, and an encapsulant 130 encapsulating the support member 110 and the semiconductor chip 120.

The connection member 140 may include an insulating member 141 and the redistribution layer 145 formed on the insulating member 141, and the redistribution layer 145 may include wiring patterns 142 disposed on the insulating member 141 and redistribution vias 143 connecting the wiring patterns 142 and the connection pads 120P to each other. The redistribution layer 145 used in the present exemplary embodiment may have a single layer structure, and the redistribution vias 143 of the redistribution layer 145 may be directly connected to the connection pads 120P of the semiconductor chip 120 (or a wiring structure of a support member in another exemplary embodiment). The redistribution layer 145 or the wiring patterns 142 may be directly connected to underbump metallurgy (UBM) vias 163.

Electrical connection structures 170 may be disposed on the second surface 140B of the connection member 140. The semiconductor package 100 may include a UBM layer 160 connecting the electrical connection structures 170 and the redistribution layer 145 to each other. The UBM layer 160 may include the UBM via 163 connected to the redistribution layer 145 of the connection member 140 and a UBM pad 162 connected to the UBM via 163.

As illustrated in FIG. 9, the semiconductor package 100 may be mounted on connection pads 210 of a board 200 such as a mainboard using the electrical connection structures 170.

As in the present exemplary embodiment, the UBM layer 160 may be introduced to suppress occurrence of cracking of the electrical connection structure 170 due to thermal impact between the electrical connection structure 170 and the redistribution layer 145, resulting in improvement of reliability.

However, the redistribution via 143 may be still vulnerable to thermal impact, and may cause a serious reliability problem particularly in a panel level package. Particularly, the redistribution via 143 is related to the redistribution layer 145 directly connected to the UBM via, and may thus be easily exposed to thermal impact transferred through the UBM layer 160. In the present exemplary embodiment, a design of the UBM layer 160 and the redistribution via 143 capable of significantly decreasing stress that may be applied to the redistribution via 143 may be provided.

Figure 11:
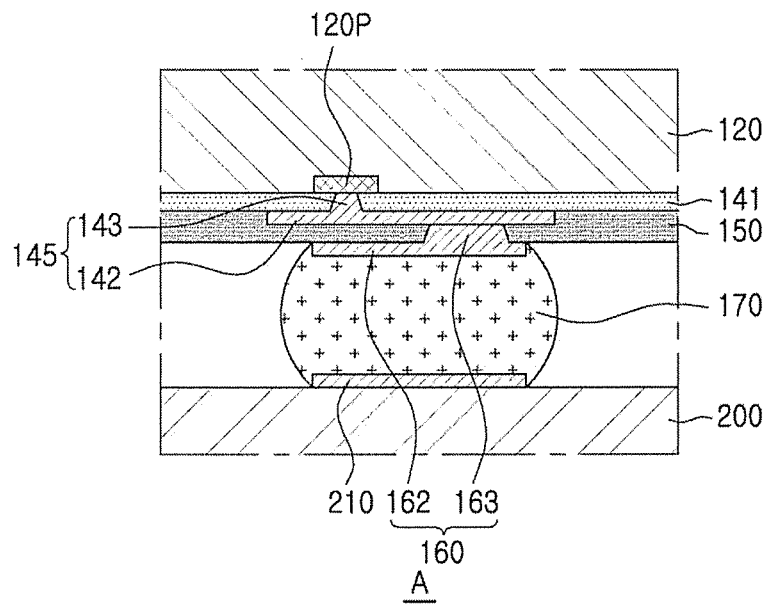
FIG. 11 is an enlarged view illustrating a partial region (part A) of the semiconductor package illustrated in FIG. 9.
Figure 12:
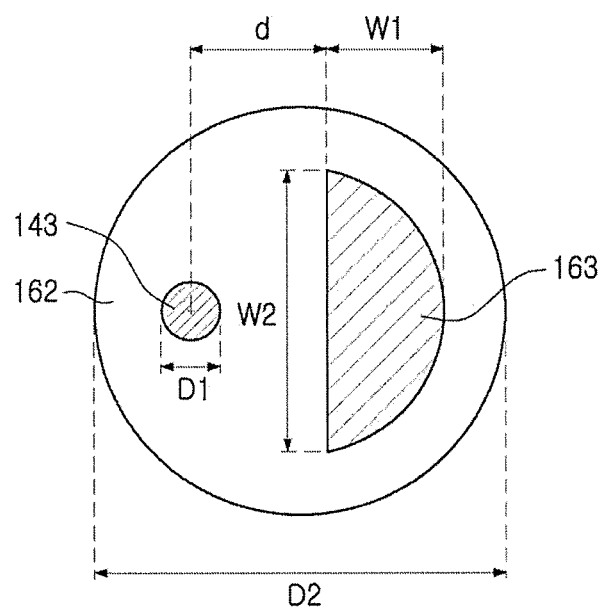
FIG. 12 is a plan view illustrating an array of an under-bump metallurgy (UBM) pad and vias of the semiconductor package illustrated in FIG. 9.

FIG. 11 is an enlarged cross-sectional view of region A of FIG. 9, illustrating an array of a UBM layer 160 and a redistribution via 143, and FIG. 12 is a plan view illustrating the array of the UBM layer 160 and the redistribution via 143 illustrated in FIG. 11.

Referring to FIGS. 11 and 12, the UBM pad 162 may be arranged to overlap the redistribution via 143 in a stacking direction of the semiconductor package 100. On the other hand, the UBM via 163 connecting the UBM pad 162 and the redistribution layer 145 to each other may be arranged so as not to overlap the redistribution via 143 with respect to the stacking direction. This structure may suppress stress transferred from the electrical connection structure 170 from being transferred to the redistribution via 143 through the UBM layer 160.

In detail, as illustrated in FIG. 12, the redistribution via 143 and the UBM via 163 may be arranged so as not to overlap each other with respect to the stacking direction while being disposed in a region in which they overlap the UBM pad 162.

When a diameter of the redistribution layer 145 and a diameter of the UBM pad 162 are D1 and D2, respectively, and the shortest distance from the center of the redistribution via 143 to the UBM via 163 is d, a first width W1 of the UBM via 163 may satisfy the following Equation 1:

$$D1 < W1 < (D2/2) + (d - D1/2) \quad \text{(Equation 1)}.$$

That is, the first width W1 of the UBM via 163 may be greater than the diameter D1 of the redistribution via 143, and the redistribution via 143 and the UBM via 163 do not overlap each other.

Figure 13:
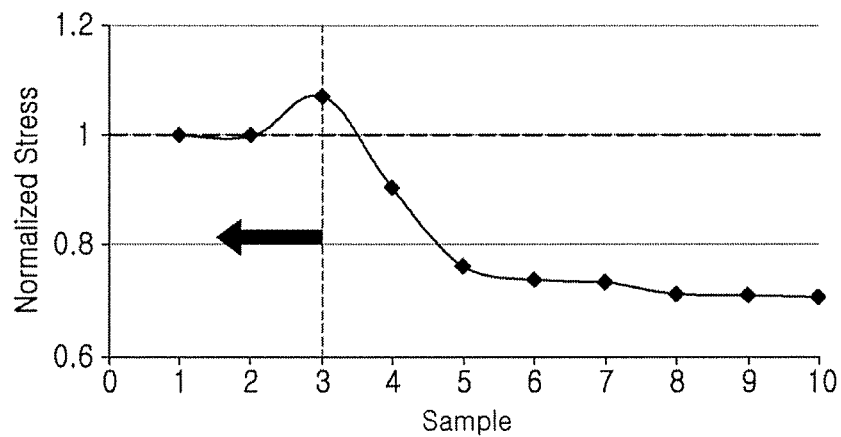
FIG. 13 is a graph illustrating stress applied to a redistribution via depending on an interval between a UBM via and the redistribution via.

Stress applied to the redistribution via 143 may be changed depending on an interval between the redistribution via 143 and the UBM via 163. FIG. 13 is a graph illustrating a change in stress applied to the redistribution via 143 in ten samples in which intervals between the redistribution via 143 and the UBM via 163 are different from one other.

Referring to FIG. 13, Sample 1 is an example in which the UBM via 163 has a circular shape in which a diameter thereof is five times the diameter of the redistribution via 143 and the redistribution via 143 completely overlaps the UBM via 163 to be tangent to a circumference of the UBM via 163, and Samples 2 to 10 are examples in which intervals between the redistribution via 143 and the UBM via 163 are gradually increased by decreasing a diameter of the UBM via 163 to a radius of the redistribution via 143. In detail, in Samples 2 and 3, the redistribution via 143 and the UBM via 163 partially overlap each other.

In Sample 4 corresponding a sample in which the redistribution via 143 and the UBM via 163 are spaced apart from each other, stress applied to the redistribution via 143 starts to be decreased, and in Sample 5, stress applied to the redistribution via 143 starts to be decreased to a level less than 80% of that of Sample 1. In Sample 5, the shortest distance d from the center of the redistribution via 143 to the UBM via 163 corresponds to 1.5 times the diameter D1 of the redistribution via 143.

As described above, in order to block propagation of the stress by sufficiently spacing the redistribution via 143 to the UBM via 163 apart from each other, the shortest distance d from the center of the redistribution via 143 to the UBM via 163 may be 1.5 times or more the diameter D1 of the redistribution via 143.

Meanwhile, a cross-sectional area of the UBM via 163 may be greater than that of the redistribution via 143. The cross-sectional area of the UBM via 163 may be 30% or more of an area of the UBM pad 162 in order to secure a sufficient contact area between the UBM pad 162 and the UBM via 163.

In the present exemplary embodiment, a cross section of the redistribution via 143 may have substantially a circular shape, while a cross section of the UBM via 163 may have a non-circular shape. Such a shape of the cross section of the UBM via 163 may be advantageous in securing the sufficient contact area between the UBM pad 162 and the UBM via 163 under the same condition in which the redistribution via 143 and the UBM via 163 are sufficiently spaced apart from each other in a region in which the UBM via overlaps the UBM pad.

In order to sufficiently secure both of the interval d between the redistribution via 143 and the UBM via 163 and the contact area between the UBM pad 162 and the UBM via 163, when the cross section of the UBM via 163 has a first width W1 in a first direction referring to a diameter direction of the UBM pad 162 passing through the center of the redistribution via 143 and a second width W2 in a second direction perpendicular to the first direction, a shape of the UBM pad 162 may be selected that the second width W2 is greater than the first width W1. These various shapes will be described below with reference to FIG. 16.

As described above, the stress applied to the redistribution via 143 may be significantly decreased to effectively prevent a defect such as cracking of the redistribution via 143 or interface delamination. In addition, a stable contact between the UBM pad 162 and the UBM via 163 may be secured.

The respective components included in the semiconductor package 100 according to the present exemplary embodiment will hereinafter be described in more detail.

The support member 110 may maintain rigidity of the semiconductor package 100, and serve to secure uniformity of a thickness of the encapsulant 130. The redistribution layer 145 including the wiring patterns 142 and the redistribution vias 143 may be introduced onto the support member 110. In this case, the semiconductor package 100 may be utilized as a package-on-package (POP) type fan-out package (see FIG. 17). The semiconductor chip 120 may be disposed in the cavity 110H to be spaced apart from sidewalls of the support member 110 by a predetermined distance. Side surfaces of the semiconductor chip 120 may be surrounded by the support member 110. However, such a form is only an example and may be variously modified to have other forms, and the support member 110 may perform another function depending on such a form. In some exemplary embodiments, the support member 110 may be omitted.

The support member 110 may include an insulating layer. A material of the insulating layer may be a thermosetting resin such as an epoxy resin, a thermoplastic resin such as a polyimide resin, a resin in which the thermosetting resin or the thermoplastic resin is mixed with an inorganic filler or is impregnated together with an inorganic filler in a core material such as a glass fabric, for example, prepreg, Ajinomoto Build up Film (ABF), FR-4, Bismaleimide Triazine (BT), or the like. When a material having high rigidity, such as prepreg including a glass fabric, or the like, is used as the material of the insulating layer, the support member 110 may be utilized as a support member for controlling warpage of the semiconductor package 100.

The semiconductor chip 120 may be an integrated circuit (IC) provided in an amount of several hundred to several million or more elements integrated in a single chip. In this case, the IC may be, for example, a processor chip (more specifically, an application processor (AP)) such as a central processor (for example, a CPU), a graphic processor (for example, a GPU), a field programmable gate array (FPGA), a digital signal processor, a cryptographic processor, a micro processor, a micro controller, or the like, but is not limited thereto. That is, the IC may be a logic chip such as an analog-to-digital converter, an application-specific IC (ASIC), or the like, or a memory chip such as a volatile memory (for example, a DRAM), a non-volatile memory (for example, a ROM), a flash memory, or the like. In addition, the abovementioned elements may also be combined with each other and be disposed.

The semiconductor chip 120 may be formed on the basis of an active wafer. In this case, a base material of a body may be silicon (Si), germanium (Ge), gallium arsenide (GaAs), or the like. Various circuits may be formed on the body. The connection pads 120P may electrically connect the semiconductor chip 120 to other components. A material of each of the connection pads 120P may be a conductive material such as aluminum (Al), or the like. A passivation layer (not illustrated) exposing the connection pads 120P may be formed on the body, and may be an oxide film, a nitride film, or the like, or a double layer of an oxide layer and a nitride layer. A lower surface of the connection pad 120P may have a step with respect to a lower surface of the encapsulant 130 through the passivation layer. Resultantly, a phenomenon in which the encapsulant 130 bleeds into the lower surface of the connection pads 120P may be prevented to some extent. An insulating layer (not illustrated), and the like, may also be further disposed in other required positions. The semiconductor chip 120 may be a bare die, a redistribution layer (not illustrated) may further be formed on an active surface (a surface on which the connection pads 120P are formed) of the semiconductor chip 120, if necessary, and bumps (not illustrated), or the like, may be connected to the connection pads 120P.

The encapsulant 130 may be provided in order to protect the support member 110 and an electronic component such as the semiconductor chip 120, and the like. An encapsulation form of the encapsulant 130 is not particularly limited, but may be a form in which the encapsulant 130 surrounds at least portions of the support member 110, the semiconductor chip 120, and the like. For example, the encapsulant 130 may cover an upper surface of the support member 110 and the semiconductor chip 120, and fill spaces between sidewalls of the cavity 110H and the side surfaces of the semiconductor chip 120. In addition, the encapsulant 130 may also fill at least portions of a space between the semiconductor chip 120 and the connection member 140. Meanwhile, the encapsulant 130 may fill the cavity 110H to thus serve as an adhesive and reduce buckling of the semiconductor chip 120 depending on certain materials.

For example, a thermosetting resin such as an epoxy resin, a thermoplastic resin such as a polyimide resin, a resin in which the thermosetting resin and the thermoplastic resin are mixed with an inorganic filler or are impregnated together with an inorganic filler in a core material such as a glass fabric, or the like, for example, prepreg, ABF, FR-4, BT, or the like, may be used as a material of the encapsulant 130. In some exemplary embodiments, a PID resin may also be used as the material of the encapsulant 130.

The connection member 140 may redistribute the connection pads 12 OP of the semiconductor chip 120, as described above. Several tens to several hundreds of connection pads 120P of the semiconductor chip 120 having various functions may be redistributed by the connection member 140, and may be physically or electrically externally connected through the electrical connection structures 170 depending on the functions.

The connection member 140 may be disposed on one surface of the support member 110 and the semiconductor chip 120, and a case in which the connection member 140 includes a single redistribution layer is illustrated in the present exemplary embodiment, but the connection member 140 may also be implemented to include a plurality of redistribution layers. In this case, an array of a redistribution via and a UBM layer according to the present exemplary embodiment will be described below with reference to FIG. 14.

A case in which the insulating member 141 used in the connection member 140 is a single insulating layer is illustrated, and the insulating member 141 may be formed of a photosensitive insulating material such as a PID resin, in addition to the insulating material described above. The insulating member 141 may be a photosensitive insulating layer including an insulating resin and an inorganic filler. For example, a content of inorganic filler in the insulating member may be 10 wt % or less based on the insulating material.

The redistribution layer 145 may include the wiring patterns 142 disposed on the insulating member, and may serve to redistribute the connection pads 120P together with the redistribution vias 143. The wiring patters 142 and the vias 143 may include, for example, a conductive material such as copper (Cu), aluminum (Al), silver (Ag), tin (Sn), gold (Au), nickel (Ni), lead (Pb), titanium (Ti), or alloys thereof. For example, the wiring patterns 142 may include ground (GND) patterns, power (PWR) patterns, signal (S) patterns, and the like. Here, the signal (S) patterns may include various signals except for the ground (GND) patterns, the power (PWR) patterns, and the like, such as data signals, and the like. For example, a thickness of the wiring pattern 142 may be approximately 0.5 μm to 15 μm.

The UBM layer 160 may improve connection reliability of the electrical connection structure 170 to improve board level reliability of the semiconductor package 100. The UBM layer 160 may be connected to the redistribution layer 145 of the connection member 140 exposed through the openings of the passivation layer 150. The UBM layer 160 may be formed in the openings by any known metallization method using any known conductive material such as a metal, but is not limited thereto.

The electrical connection structure 170 may physically or electrically externally connect the semiconductor package 100. For example, the semiconductor package 100 may be mounted on the mainboard of the electronic device through the electrical connection structures 170. Each of the electrical connection structures 170 may be formed of a conductive material, for example, a low melting point metal, or the like. However, this is only an example, and a material of each of the electrical connection structures 170 is not particularly limited thereto. For example, each of the electrical connection structures 170 may be a land, a ball, a pin, or the like. The electrical connection structures 170 may be formed as a multilayer or single layer structure. When the electrical connection structures 170 are formed as a multilayer structure, the electrical connection structures 170 may include a copper (Cu) pillar and a low melting point metal ball. When the electrical connection structures 170 are formed as a single layer structure, the electrical connection structures 170 may include a low melting point metal such as a tin-silver or copper (Cu). However, this is only an example, and the electrical connection structures 170 are not limited thereto. The number, an interval, a disposition form, and the like, of electrical connection structures 170 are not particularly limited, but may be sufficiently modified depending on design particulars by those skilled in the art. For example, the electrical connection structures 170 may be provided in an amount of several tens to several thousands according to the number of connection pads 120P, or may be provided in an amount of several tens to several thousands or more or several tens to several thousands or less.

At least one of the electrical connection structures 170 may be disposed in a fan-out region. The fan-out region refers to a region except for a region in which the semiconductor chip 120 is disposed. The fan-out package may have excellent reliability as compared to a fan-in package, may implement a plurality of input/output (I/O) terminals, and may facilitate a 3D interconnection. In addition, as compared to a ball grid array (BGA) package, a land grid array (LGA) package, or the like, the fan-out package may be manufactured to have a small thickness.

Meanwhile, although not illustrated in the drawings, a metal thin film may be formed on the walls of the cavity 110H, if necessary, in order to dissipate heat or block electromagnetic waves. In some exemplary embodiments, a plurality of semiconductor chips 120 performing functions that are the same as or different from each other may be disposed in the cavity 110H, if necessary. In some exemplary embodiments, a separate passive component such as an inductor, a capacitor, or the like, may be disposed in the cavity 110H. In some exemplary embodiments, a passive component, for example, a surface mounting technology (SMT) component including an inductor, a capacitor, or the like, may be disposed on a surface of the passivation layer 150.

Figure 14:
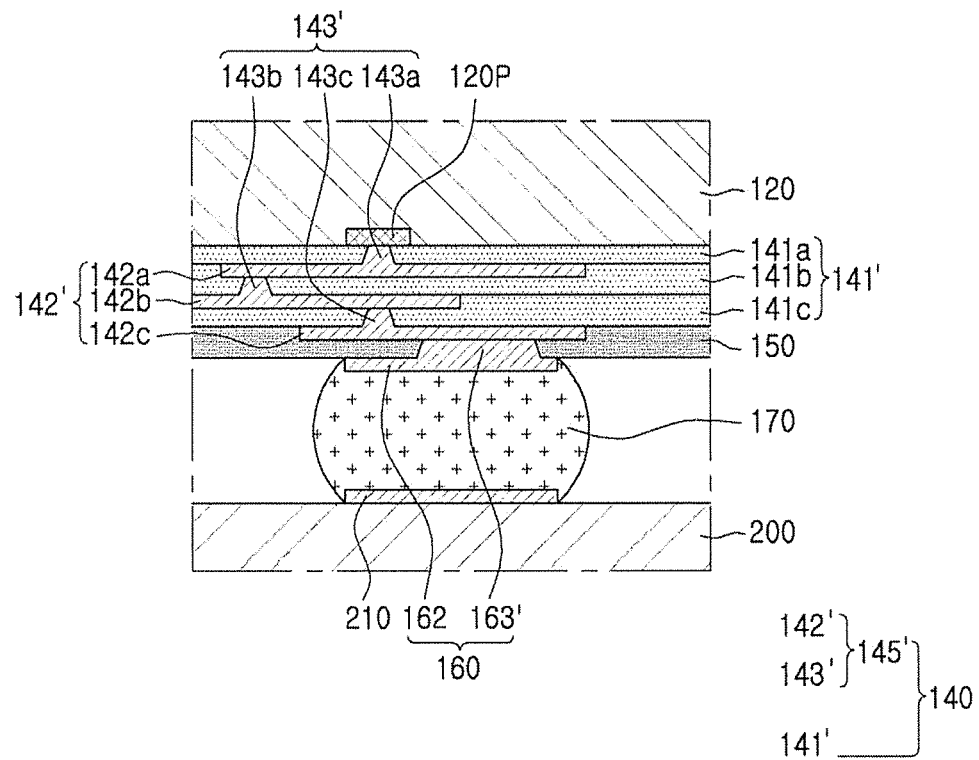
FIG. 14 is a cross-sectional view illustrating redistribution and UBM structures of a semiconductor package according to another exemplary embodiment in the present disclosure.
Figure 15:
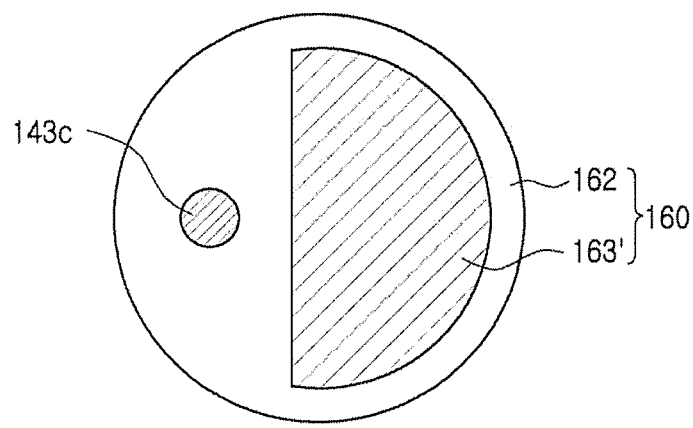
FIG. 15 is a plan view illustrating an array of a UBM pad and vias of the semiconductor package illustrated in FIG. 14.

FIG. 14 is a cross-sectional view illustrating redistribution and UBM structures of a semiconductor package according to another exemplary embodiment in the present disclosure, and FIG. 15 is a plan view illustrating an array of a UBM pad and vias of the semiconductor package illustrated in FIG. 14.

A connection member 140 used in a semiconductor package illustrated in FIG. 14 may include a plurality of redistribution layers 145'. That is, the plurality of redistribution layers 145' may include a first wiring layer having a first wiring pattern 142a and a first redistribution via 143a, a second wiring layer having a second wiring pattern 142b and a second redistribution via 143b, and a third wiring layer having a third wiring pattern 142c and a third redistribution via 143c.

In detail, the connection member 140 may include a first insulating layer 141a disposed on a support member and a semiconductor chip 120, a first wiring pattern 142a disposed on the first insulating layer 141a, a first redistribution via 143a connecting the first insulating layer 141a and a connection pad 120P of the semiconductor chip 120 to each other, a second insulating layer 141b disposed on the first insulating layer 141a and covering the first wiring pattern 142a, a second wiring pattern 142b disposed on the second insulating layer 141b, a second redistribution via 143b penetrating through the second insulating layer 141b and connecting the first and second wiring patterns 142a and 142b to each other, a third insulating layer 141c disposed on the second insulating layer 141b and covering the second wiring pattern 142b, a third wiring pattern 142c disposed on the third insulating layer 141c, and a third redistribution via 143c penetrating through the third insulating layer 141c and electrically connecting the second and third wiring patterns 142b and 142c to each other.

In the present exemplary embodiment, the first redistribution via 143a may be directly connected to the connection pad 120P of the semiconductor chip 120, and the third redistribution via 143c may be connected to the third wiring pattern 143c connected to a UBM via 163'. It may be understood that the third wiring via 143c is a redistribution via severely exposed to thermal impact, such as the redistribution via illustrated in FIGS. 9 through 11. In addition, the third wiring pattern 142c, which is a wiring pattern directly connected to the UBM via 163', may be provided as a redistribution pad formed in a region corresponding to a UBM pad 162.

Referring to FIGS. 14 and 15, the second redistribution via 143b may be disposed so as not to overlap the first redistribution via 143a and the third redistribution via 143c. The first redistribution via 143a and the third redistribution via 143c may be disposed to overlap the UBM pad 162, but may be disposed so as not to overlap the UBM via 163'. Meanwhile, the UBM via 163' may also be formed to go beyond a central line of the UBM pad 162 in order to secure a sufficient contact area between the UBM via 163' and the UBM pad 162, unlike the exemplary embodiment described above.

This structure may suppress stress propagated from a UBM layer 160 from being applied to a redistribution via 143, and particularly, may significantly decrease stress applied to the third redistribution via 143c.

In the connection member 140 used in the semiconductor package, the respective insulating layers 141a, 141b, and 141c may not be easily distinguished from each other, and may be observed as a single insulating member 141. In this case, the connection member 140 illustrated in FIG. 14 may be represented as including a first redistribution layer disposed on a first level of the insulating member 141 and including the first redistribution via 143a, a second redistribution layer disposed on a second level of the insulating member 141 above the first level and including the second redistribution via 143b, and a third redistribution layer disposed on the insulating member 141 and including the third redistribution via 143c.

FIGS. 16A through 16D are plan views illustrating various examples of a UBM via of the semiconductor package according to another exemplary embodiment in the present disclosure.

As described above, in order to sufficiently secure both of the interval between the redistribution via 143 and the UBM via and the contact area between the UBM pad 162 and the UBM via, UBM vias 163a, 163b, 163c, and 163d may have cross sections having various shapes, which are non-circular shapes. Here, it may be understood that the redistribution via 143 is a redistribution via related to a redistribution layer directly connected to the UBM via 163'.

Figure 16A:
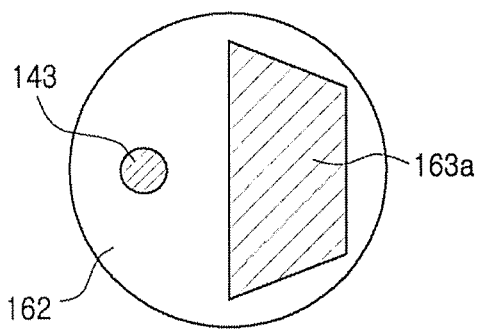
FIGS. 16A through 16D are plan views illustrating various examples of a UBM via of the semiconductor package according to another exemplary embodiment in the present disclosure.
Figure 16B:
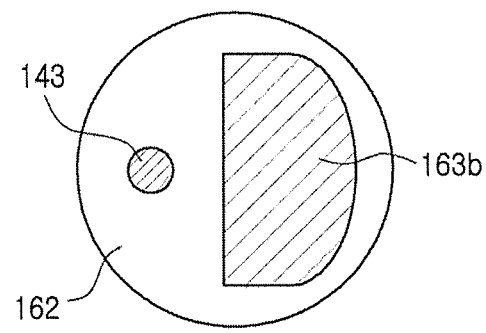
Figure 16C:
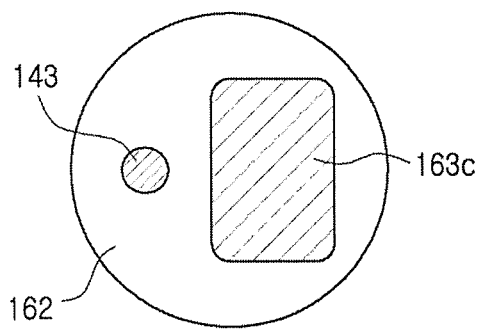
Figure 16D:
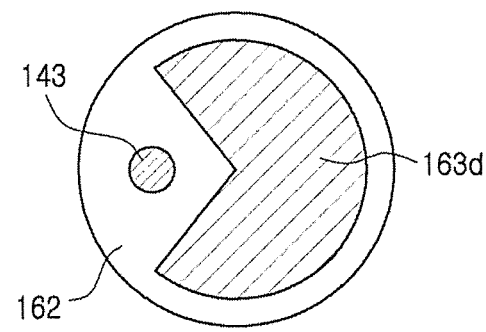

For example, a cross section of the UBM via 163a may have a trapezoidal shape arranged to have an area as large as possible along an arc (see FIG. 16A). Cross sections of the UBM vias 163b and 163c may have, respectively, a shape similar to a rectangular shape, of which one side is convex or a rectangular shape (see FIGS. 16B and 16C). In addition, across section of the UBM via 163d may be a portion of a circle of which a central angle is greater than 180° (see FIG. 16D).

As described above, in order to sufficiently secure both of the interval between the redistribution via and the UBM via and the contact area between the UBM pad and the UBM via, the cross sections of the UBM vias 163a, 163b, 163c, and 163d may have various shapes in which a width perpendicular to a width defined in a diameter direction of the UBM pad 162 passing through the center of the redistribution via 143 is greater than the width defined in the diameter direction of the UBM pad 161.

The shapes of the cross sections of the UBM vias 163a, 163b, 163c, and 163d illustrated in FIGS. 16A through 16D may be advantageous in sufficiently securing the contact areas between the UBM pad 162 and the UBM vias 163a, 163b, 163c, and 163d under a condition in which the redistribution via 143 and the UBM vias 163a, 163b, 163c, and 163d are sufficiently spaced apart from each other in regions in which the UBM vias 163a, 163b, 163c, and 163d overlap the UBM pad 162.

Figure 17:
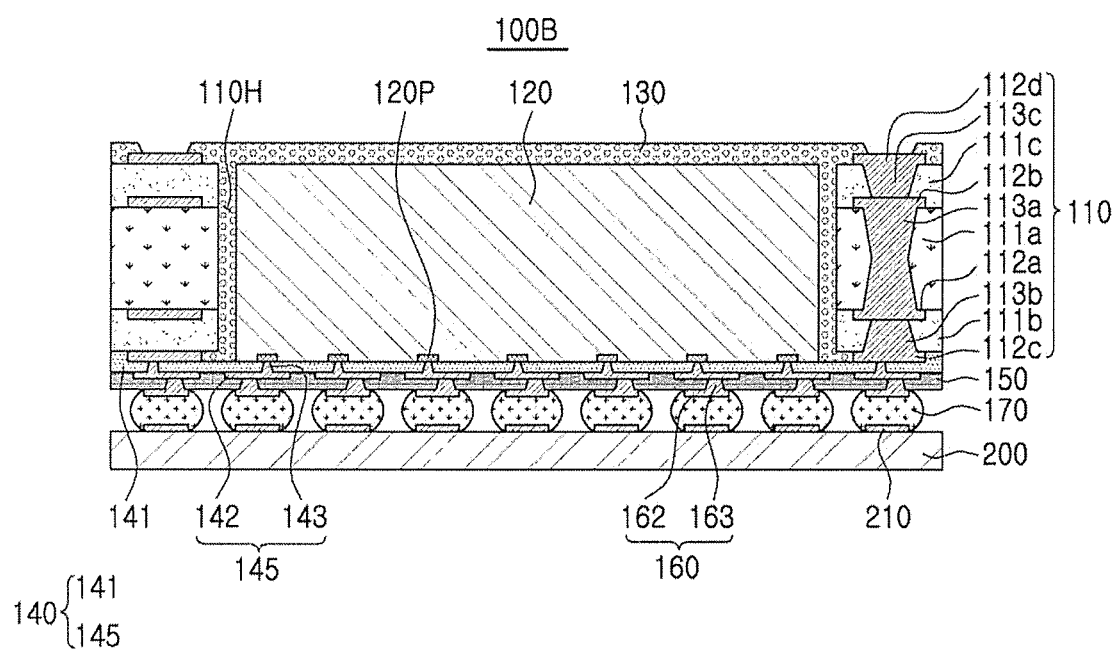
FIG. 17 is a side cross-sectional view illustrating a semiconductor package according to still another exemplary embodiment in the present disclosure.

FIG. 17 is a side cross-sectional view illustrating a semiconductor package 100B according to another exemplary embodiment in the present disclosure.

Referring to FIG. 17, it may be understood that the semiconductor package 100B has a structure similar to the structure illustrated in FIG. 9 except that it includes a support member 110 having a wiring structure. Components according to the present exemplary embodiments may be understood with reference to the description for the same or similar components of the semiconductor package 100 illustrated in FIG. 9 unless explicitly described to the contrary.

The support member 110 used in the present exemplary embodiment may include a first dielectric layer 111a, a first wiring layer 112a and a second wiring layer 112b disposed on opposite surfaces of the first dielectric layer 111a, respectively, a second dielectric layer 111b disposed on the first dielectric layer 111a and covering the first wiring layer 112a, a third wiring layer 112c disposed on the second dielectric layer 111b, a third dielectric layer 111c disposed on the first dielectric layer 111a and covering the second wiring layer 112b, and a fourth wiring layer 112d disposed on the third dielectric layer 111c. The first to fourth wiring layers 112a, 112b, 112c, and 112d may be electrically connected to connection pads 120P of a semiconductor chip 120.

Since the support member 110 may include a larger number of first to fourth wiring layers 112a, 112b, 112c, and 112d, a connection member 140 may further be simplified. Therefore, a decrease in a yield depending on a defect occurring in a process of forming the connection member 140 may be suppressed.

Meanwhile, the first to fourth wiring layers 112a, 112b, 112c, and 112d may be electrically connected to each other through first to third vias 113a, 113b, and 113c each penetrating through the first to third dielectric layers 111a, 111b, and 111c.

The first dielectric layer 111a may have a thickness greater than those of the second dielectric layer 111b and the third dielectric layer 111c. The first dielectric layer 111a may be basically relatively thick in order to maintain rigidity, and the second dielectric layer nib and the third dielectric layer 111c may be introduced in order to form a larger number of wiring layers 112c and 112d. The first dielectric layer 111a may include an insulating material different from those of the second dielectric layer nib and the third dielectric layer 111c. For example, the first dielectric layer 111a may be, for example, prepreg including a core material, a filler, and an insulating resin, and the second dielectric layer 111b and the third dielectric layer 111c may be an ABF or a PID film including a filler and an insulating resin. However, the materials of the first dielectric layer 111a and the second and third dielectric layers 111b and 111c are not limited thereto. Similarly, a first via 113a penetrating through the first dielectric layer 111a may have a diameter greater than those of a second via 113b and a third via 113c each penetrating through the second dielectric layer 111b and the third dielectric layer 111c.

A lower surface of the third wiring layer 112c of the support member no may be disposed on a level below a lower surface of the connection pad 120P of the semiconductor chip 120. In addition, a distance between a wiring pattern 142 of the connection member 140 and the third wiring layer 112c of the support member 110 may be smaller than that between the wiring pattern 142 of the connection member 140 and the connection pad 120P of the semiconductor chip 120.

The reason is that the third wiring layer 112c may be disposed on the second dielectric layer 111b in a protruding form as in the present exemplary embodiment, resulting in being in contact with the connection member 140. The first wiring layer 112a and the second wiring layer 112b of the support member 110 may be disposed on a level between an active surface and an inactive surface of the semiconductor chip 120 with respect to the stacking direction. Since the support member 110 may be formed at a thickness corresponding to that of the semiconductor chip 120, the first wiring layer 112a and the second wiring layer 112b formed in the support member 110 may be disposed on the level between the active surface and the inactive surface of the semiconductor chip 120.

A thickness of each of the first to fourth wiring layers 112a, 112b, 112c, and 112d of the support member 110 may be greater than that of the wiring pattern 142 of the connection member 140. Since the support member 110 may have a thickness equal to or greater than that of the semiconductor chip 120, the first to fourth wiring layers 112a, 112b, 112c, and 112c may also be formed to have larger sizes. On the other hand, the wiring pattern 142 of the connection member 140 may be formed to have a relatively small size for thinness.

In thermal cycle and impact reliability evaluation tests for the semiconductor package, higher stress is applied to a redistribution via disposed in an outer region of the semiconductor chip 120 or outside the semiconductor package than to a redistribution via disposed inside the semiconductor chip 120 or the semiconductor package, and the possibility that a crack or interface delamination will occur is thus higher in the redistribution via disposed in the outer region of the semiconductor chip 120 or outside the semiconductor package than in the redistribution via disposed inside the semiconductor chip 120 or the semiconductor package. Therefore, in the support member corresponding to a region in which the stress is concentrated or the outer region of the semiconductor chip adjacent to the support member, an array of the redistribution via and the UBM layer may be implemented as suggested in the present exemplary embodiment.

As set forth above, according to the exemplary embodiments in the present disclosure, stress applied to a redistribution layer may be decreased by adjusting a structure and an array of a UBM pad and a UBM via related to a redistribution via of the redistribution layer. Resultantly, reliability of the semiconductor package for thermal impact may be improved.

While exemplary embodiments have been shown and described above, it will be apparent to those skilled in the art that modifications and variations could be made without departing from the scope of the present invention as defined by the appended claims.

What is claimed is:

1. A semiconductor package comprising:
a connection member having a first surface and a second surface opposing each other in a stacking direction of the semiconductor package and including an insulating member and a plurality of redistribution layers disposed on different levels in the insulating member in the stacking direction, the plurality of redistribution layers having a plurality of wiring patterns adjacent to the second surface and a plurality of redistribution vias connected to the plurality of wiring patterns, respectively;
a semiconductor chip disposed on the first surface of the connection member and having connection pads connected to the plurality of redistribution layers;
an encapsulant disposed on the first surface of the connection member and encapsulating the semiconductor chip;
an insulation layer disposed on the second surface of the connection member;
a plurality of underbump metallurgy (UBM) pads disposed on the insulation layer; and
a plurality of UBM vias connecting the plurality of UBM pads to the plurality of wiring patterns through the insulation layer, and none of the UBM vias overlap any of the plurality of redistribution vias on the different levels,
wherein each of the plurality of wiring patterns has a thickness of 0.5 μm to 15 μm, and
wherein each of the plurality of UBM vias has a first width in a first direction referring to a diameter direction of a corresponding UBM pad and a second width in a second direction perpendicular to the first direction, and the second width is greater than the first width.

2. The semiconductor package of claim 1, wherein D1<W1<(D2/2)+(d−D1/2) in which W1 is a width of a UBM via defined in the diameter direction of the corresponding UBM pad, D1 and D2 are, respectively, a diameter of a corresponding redistribution via and a diameter of the corresponding UBM pad, and d is a shortest distance from a center axis of the corresponding redistribution via to the UBM via.

3. The semiconductor package of claim 1, wherein a shortest distance from a center axis of a corresponding redistribution via to the UBM via is 1.5 times or more a diameter of the corresponding redistribution via.

4. The semiconductor package of claim 1, wherein, in plan view, an area of the UBM via is greater than that of a corresponding redistribution via.

5. The semiconductor package of claim 1, wherein, in plan view, an area of the UBM via is 30% or more of an area of the corresponding UBM pad.

6. The semiconductor package of claim 1, wherein, in plan view, a corresponding redistribution via has a circular shape, and the UBM via has a semicircular, trapezoidal, or rectangular shape.

7. The semiconductor package of claim 1, wherein the plurality of redistribution layers includes a first redistribution layer, a second redistribution layer, and a third redistribution layer each disposed on different levels of the insulating member in the stacking direction, and
the third redistribution layer is disposed to be adjacent to the second surface and includes a wiring pattern having a redistribution pad.

8. The semiconductor package of claim 1, further comprising a support member disposed on the first surface of the connection member and having a cavity in which the semiconductor chip is accommodated.

9. The semiconductor package of claim 8, wherein the support member has a wiring structure that connects upper and lower surfaces of the support member to each other, and the wiring structure is connected to at least one redistribution layer of the plurality of redistribution layers of the connection member.

10. The semiconductor package of claim 8, wherein the support member includes one or more dielectric layers and one or more wiring layers each disposed on opposite surfaces of the one or more dielectric layers, and
the one or more wiring layers are electrically connected to the connection pads of the semiconductor chip.

11. The semiconductor package of claim 10, wherein the one or more wiring layers are electrically connected to each other through one or more vias each penetrating through the one or more dielectric layers.

12. The semiconductor package of claim 10, wherein a lower surface of a bottommost wiring layer among the one or more wiring layers is disposed on a level lower, in the stacking direction, than a lower surface of the connection pads of the semiconductor chip.

13. A semiconductor package comprising:
a connection member having a first surface and a second surface opposing each other in a stacking direction of the semiconductor package and including an insulating member and a plurality of redistribution layers disposed on different levels in the insulating member in the stacking direction, the plurality of redistribution layers having a plurality of wiring patterns adjacent to the second surface and a plurality of redistribution vias connected to the plurality of wiring patterns, respectively, each of the plurality of wiring patterns having a thickness of 0.5 μm~15 μm and a redistribution via of the plurality of redistribution vias connecting the wiring pattern, and the plurality of redistribution layers including at least a first redistribution layer adjacent to the first surface and a second redistribution layer adjacent to the second surface;
a semiconductor chip disposed on the first surface of the connection member and having connection pads connected to the plurality of redistribution layers;
an encapsulant disposed on the first surface of the connection member and encapsulating the semiconductor chip;

an insulation layer disposed on the second surface of the connection member;

a plurality of underbump metallurgy (UBM) pads disposed on the insulation layer; and a plurality of UBM vias connecting the plurality of wiring patterns to the plurality of UBM pads through the insulation layer, and none of the UBM vias overlap any of the plurality of redistribution vias on the different levels, wherein the UBM via has a first width in a first direction referring to a diameter direction of a corresponding UBM pad and a second width in a second direction perpendicular to the first direction, and the second width is greater than the first width.

14. The semiconductor package of claim 13, wherein the plurality of redistribution layers further include at least one redistribution layer additionally disposed between the first redistribution layer and the second redistribution layer.

15. The semiconductor package of claim 14, wherein a shortest distance from a center axis of a corresponding redistribution via to the UBM via is 1.5 times or more a diameter of the corresponding redistribution via.

16. A semiconductor package comprising:

an insulating member having a first surface and a second surface opposing each other;

a plurality of redistribution layers disposed on different levels in the insulating member in a stacking direction, the plurality of redistribution layers having a plurality of wiring patterns adjacent to the second surface and a plurality of redistribution vias connected to the plurality of wiring patterns, respectively, each of the plurality of wiring patterns having a thickness of 0.5 μm to 15 μm and a redistribution via of the plurality of redistribution vias connecting the wiring pattern, and the plurality of redistribution layers including at least a first redistribution layer adjacent to the first surface and a second redistribution layer adjacent to the second surface;

a semiconductor chip disposed on the first surface of the insulating member and having connection pads connected to the plurality of redistribution layers;

an encapsulant disposed on the first surface of the insulating member and encapsulating the semiconductor chip;

an insulation layer disposed on the second surface of the insulating member;

a plurality of underbump metallurgy (UBM) pads disposed on the insulation layer; and a plurality of UBM vias connecting the plurality of wiring patterns to the plurality of UBM pads through the insulation layer, and none of the UBM vias overlap any of the plurality of redistribution vias on the different levels, wherein the UBM via has a first width in a first direction referring to a diameter direction of a corresponding UBM pad and a second width in a second direction perpendicular to the first direction, and the second width is greater than the first width.

* * * * *